United States Patent
Gonthier et al.

(10) Patent No.: US 7,224,087 B2
(45) Date of Patent: May 29, 2007

(54) CIRCUIT FOR THE CONTROL OF A TRIAC WITHOUT GALVANIC ISOLATION

(75) Inventors: Laurent Gonthier, Tours (FR); Benoit Peron, Tours (FR)

(73) Assignee: STMicroelectronics S.A., Montrouge (FR)

( * ) Notice: Subject to any disclaimer, the term of this patent is extended or adjusted under 35 U.S.C. 154(b) by 381 days.

(21) Appl. No.: 10/744,333

(22) Filed: Dec. 23, 2003

(65) Prior Publication Data

US 2004/0160267 A1    Aug. 19, 2004

(30) Foreign Application Priority Data

Dec. 27, 2002    (FR) .................................. 02 16802

(51) Int. Cl.
*H01H 9/54*    (2006.01)
*H03K 17/60*    (2006.01)

(52) U.S. Cl. ...................................... 307/139; 327/432
(58) Field of Classification Search ................ 307/139; 327/432
See application file for complete search history.

(56) References Cited

U.S. PATENT DOCUMENTS

| | | | |
|---|---|---|---|
| 3,526,809 A | 9/1970 | Obenhaus | |
| 3,547,348 A | 12/1970 | Kruper | |
| 3,798,462 A | 3/1974 | Rizzo | |
| 3,848,140 A | 11/1974 | Guermeur et al. | |
| 4,336,464 A | 6/1982 | Weber | |

FOREIGN PATENT DOCUMENTS

DE    31 48 115 A1    9/1982

OTHER PUBLICATIONS

French Search Report from French Patent Application 02/16802, filed Dec. 27, 2002.

*Primary Examiner*—Robert L. Deberadinis
*Assistant Examiner*—Hal I. Kaplan
(74) *Attorney, Agent, or Firm*—Lisa K. Jorgenson; James H. Morris; Wolf, Greenfield & Sacks, P.C.

(57) ABSTRACT

A circuit for controlling a bidirectional switch referenced to a first reference voltage by a control circuit supplied by a first voltage and referenced to a second reference voltage. The supply voltage of the control circuit is connected by a diode to a coupling circuit comprising a node, this node being connected to the collector of an NPN transistor having its emitter connected to the second reference voltage and having its base receiving the output of the control circuit, to a first terminal of a capacitor having its second terminal connected to the first reference voltage, to the emitter of a PNP transistor having its base connected to the collector of the transistor, and having its collector connected to the control terminal of the bidirectional switch.

3 Claims, 3 Drawing Sheets

CIRCUIT FOR THE CONTROL OF A TRIAC WITHOUT GALVANIC ISOLATION

BACKGROUND OF THE INVENTION

1. Field of the Invention

The present invention generally relates to the control of a bidirectional switch by a control circuit, such as a microprocessor, in the case where the control circuit is not referenced to the same reference voltage as the bidirectional switch control terminal.

2. Discussion of the Related Art

As illustrated in FIG. 1, there are many cases in which a control circuit μP supplied between a first voltage V1 and a first reference voltage or first ground G1, is intended to control a bidirectional switch TR referenced to a second reference voltage or ground G2. Bidirectional switch TR is for example intended to switch a load L supplied by the A.C. supply network (currently at 50 or 60 Hz). It is necessary to provide an isolation circuit between the control circuit and the bidirectional switch. A galvanic isolation circuit 1 such as an optocoupler comprising a photoemitter 2 and a photoreceiver 3 is currently used. Photoemitter 2, for example a photodiode in series with a transistor, is connected between supply voltage V1 of the control circuit and ground G1 of the control circuit. Photoreceiver 3, such as a phototransistor, is supplied between a supply voltage V2 derived from the A.C. voltage applied to the load and ground G2. A resistor 4 is arranged in series between voltage V1 and the collector of transistor 2. An impedance 5 is connected between phototransistor 3 and voltage V2. When transistor 3 is controlled to the on state, switch TR is controlled.

Although galvanic isolation circuit 1 is illustrated in FIG. 1 as an optocoupler, this galvanic isolation circuit may also be made in the form of an isolation transformer, for example, a pulse transformer.

Generally, a galvanic isolation circuit is an expensive circuit and often impossible to integrate.

SUMMARY OF THE INVENTION

An object of the present invention thus is to provide control of a bidirectional switch, and more specifically a bidirectional switch controllable with a current, by a control circuit not referenced to the same reference voltage as the switch to be controlled, without it being necessary to use a galvanic isolation circuit.

A more specific object of the present invention is to provide a circuit for controlling an electromagnetic relay.

To achieve these and other objects, the present invention provides a circuit for controlling a bidirectional switch referenced to a first reference voltage with a control circuit supplied by a first voltage and referenced to a second reference voltage. The supply voltage of the control circuit is connected by a diode to a coupling circuit comprising a node, this node being connected:

via a first impedance, to the collector of an NPN transistor having its emitter connected to the second reference voltage and having its base receiving the output of the control circuit, to a first terminal of a capacitor having its second terminal connected to the first reference voltage, to the emitter of a PNP transistor having its base connected to the collector of the NPN transistor via a second impedance, and having its collector connected to the control terminal of the bidirectional switch.

According to an embodiment of the present invention, the collector of the second transistor is connected to the control terminal of the bidirectional switch via a control current limiting resistor.

The present invention also aims at a circuit for controlling an electromagnetic relay of control of a load with an A.C. voltage, comprising a transformer which supplies, on the one hand, a control coil in series with a current-controlled bidirectional switch and, on the other hand, via a rectifier, a circuit for controlling said switch, in which the coupling between the control circuit and the bidirectional switch is such as mentioned hereabove.

The foregoing objects, features and advantages of the present invention will be discussed in detail in the following non-limiting description of specific embodiments in connection with the accompanying drawings.

DETAILED DESCRIPTION

Figure 2:
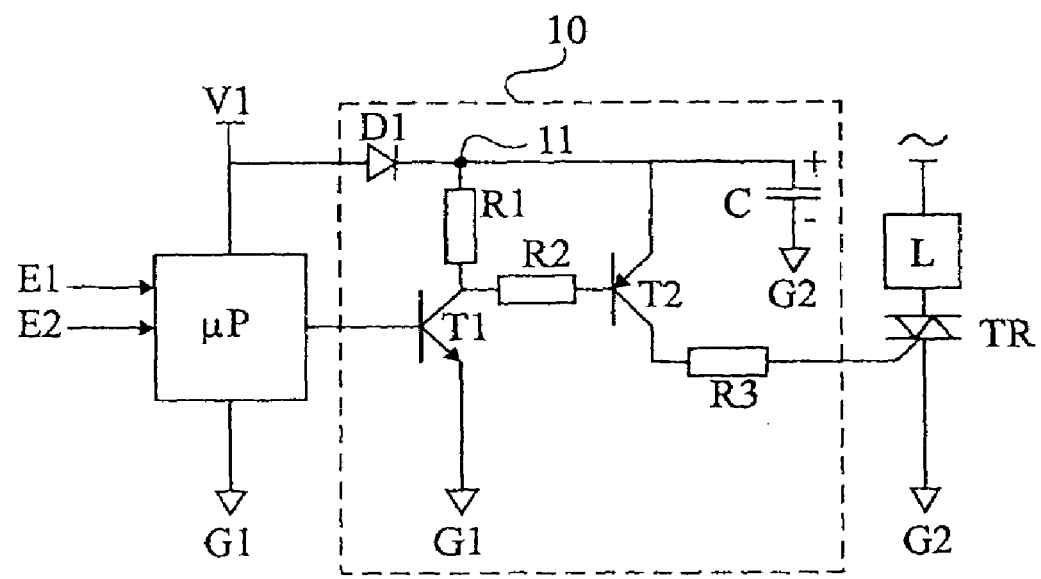
FIG. 2 illustrates a circuit for controlling a current-controlled bidirectional switch according to the present invention.

FIG. 2 shows a specific embodiment of a bidirectional switch control circuit according to the present invention. A control circuit, such as a microprocessor μP receiving control instructions on one or several input terminals E1, E2, is supplied between a D.C. positive voltage V1 and a first voltage G1, which will also be called ground G1. A triac or another current-controlled bidirectional switch TR in series with a load L is supplied between an A.C. supply source and a second reference voltage G2 or ground G2.

The present invention provides a coupling circuit 10 comprising an NPN transistor T1, the base of which receives the output of microprocessor μP, having its emitter connected to ground G1 and having its collector connected to supply voltage V1 via a resistor R1. A diode D1 is interposed between resistor R1 and supply voltage V1. The connection point of diode D1 and of resistor R1 forms a node 11 of the circuit. The collector of transistor T1 is connected via a resistor R2 to the base of a PNP transistor T2 having its emitter connected to a node 11. To this node 11 is also connected a first terminal of a capacitor C having its second terminal connected to second reference voltage G2. The collector of transistor T2 is connected, preferably via a small resistor R3, to the gate of triac TR.

The operation of coupling circuit 10 is the following. When the microprocessor sends a turn-on order to triac TR, transistor T1 turns on, which causes the turning-on of transistor T2. Capacitor C, which has previously been charged, then discharges through transistor T2, resistor R3, and the gate circuit of triac TR towards second reference voltage G2, which turns on the triac. Resistor R3 is used to limit the control current, and is selected for the discharge duration of capacitor C to be sufficient, for example, so that the triac triggers even if the turn-on order arrives close to a zero crossing of the A.C. voltage applied to the load.

Figure 1:
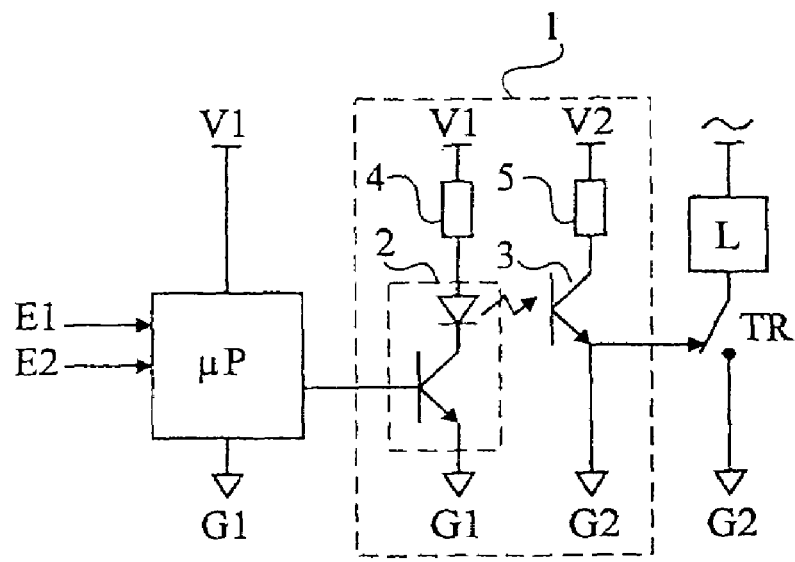
FIG. 1 illustrates a switch control circuit with a galvanic isolation.
Figure 3:
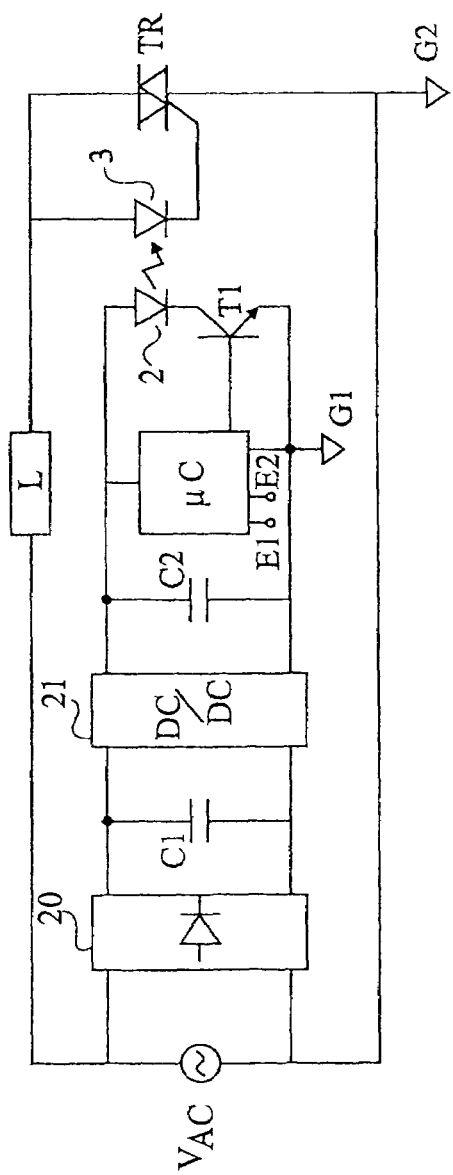
FIG. 3 shows a specific embodiment of a triac control circuit of prior art.
Figure 4:
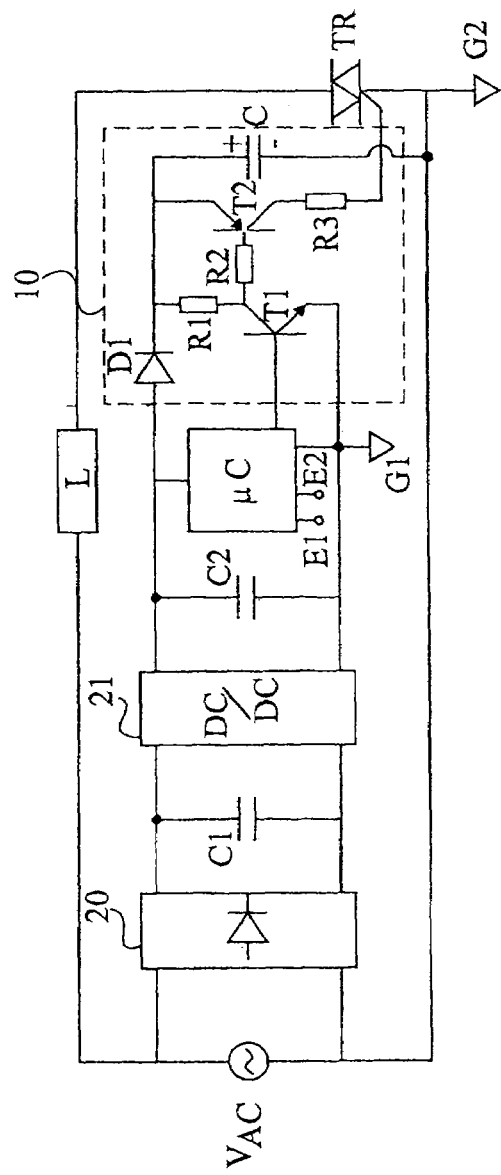
FIG. 4 shows a specific embodiment of a triac control circuit according to the present invention.

FIGS. 3 and 4 show in more detail, respectively, a circuit of prior art and a circuit according to the present invention, for controlling a triac supplied by the A.C. network, the microcontroller being supplied by a rectified voltage derived from said A.C. voltage. In FIGS. 3 and 4, same elements as in FIGS. 1 and 2 are designated with same references.

As illustrated in FIG. 3, an A.C. voltage VAC is connected across a load L and a triac TR. This A.C. voltage is also applied to a rectifying bridge 20 having its output coupled to a storage capacitor C1. The voltage across the capacitor may supply a capacitor C2 arranged on the other side of a D.C./D.C. converter 21 intended for the supply of microcontroller μC. Microcontroller μC controls a transistor T1 in series with a light-emitting diode 2 coupled with a light-receiving diode 3.

FIG. 4 shows the same circuit as that of FIG. 3 but in which the optocoupler is replaced with a coupling circuit 10 according to the present invention bearing the same reference numerals as the circuit of FIG. 2.

The present invention is particularly advantageous in the case where a load is desired to be controlled via a relay.

Figure 5:
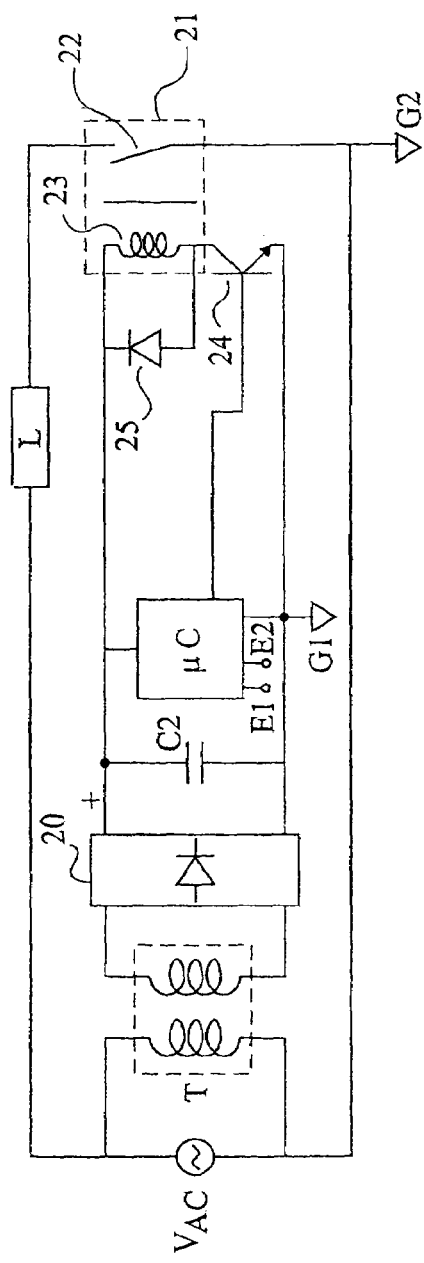
FIG. 5 shows a circuit for controlling an electromagnetic relay according to prior art.

FIG. 5 shows a conventional relay control circuit. A microcontroller μC receiving inputs E1 and E2 is supplied from an A.C. voltage, for example via a transformer T supplying a rectifying bridge 20 providing a smoothed voltage across a capacitor C2. A relay 21 is connected in series with a load L across the A.C. supply voltage VAC. Relay 21 comprises a switch 22 controlled by a coil 23. Conventionally, coil 23 is series-connected with a transistor 24 across capacitor C2, and the turning-on of transistor 24 is ensured by the output of microcontroller μC. A free wheel diode 25 is placed in parallel on coil 13, to protect transistor 24 in off phases.

Thus, conventionally, coil 23 is controlled in D.C. mode. This results in various disadvantages. Indeed, under a D.C. power supply, the coil impedance is as a first approximation reduced to its sole real part, that is, its resistance. Now, this resistance is generally small. The current necessary to obtain the required magnetic power required for an activation of relay 11 is then high, on the order of from 20 to 200 mA.

The higher the current intended to flow through the coil, the greater the dimensions of transformer T, which makes its integration difficult. This is enhanced by the fact that the power factor of a diode bridge conventionally is 0.5, whereby the apparent current is twice the active current.

Further, with a high coil current, losses by Joule effect in the windings are high.

Moreover, the higher the necessary current, the higher the capacitance of capacitor C2 must be to limit voltage variations. This leads to using a capacitance on the order of some hundred microfarads and thus a bulky capacitor.

Another disadvantage of such a control of a relay 21 with a D.C. current is the fact that, upon flowing of the D.C. current through coil 23, a magnetic field is created between coil 23 and switch 22 that it controls, which field disappears little after the turning-on with the current's stabilization. A specific device (not shown) for blocking switch 22 in the on position must then be provided.

The present invention provides modifying the conventional circuit of FIG. 5 by supplying coil 23 in A.C. mode and by using a coupling circuit 10 such as described previously in relation with FIGS. 2 and 4.

Figure 6:
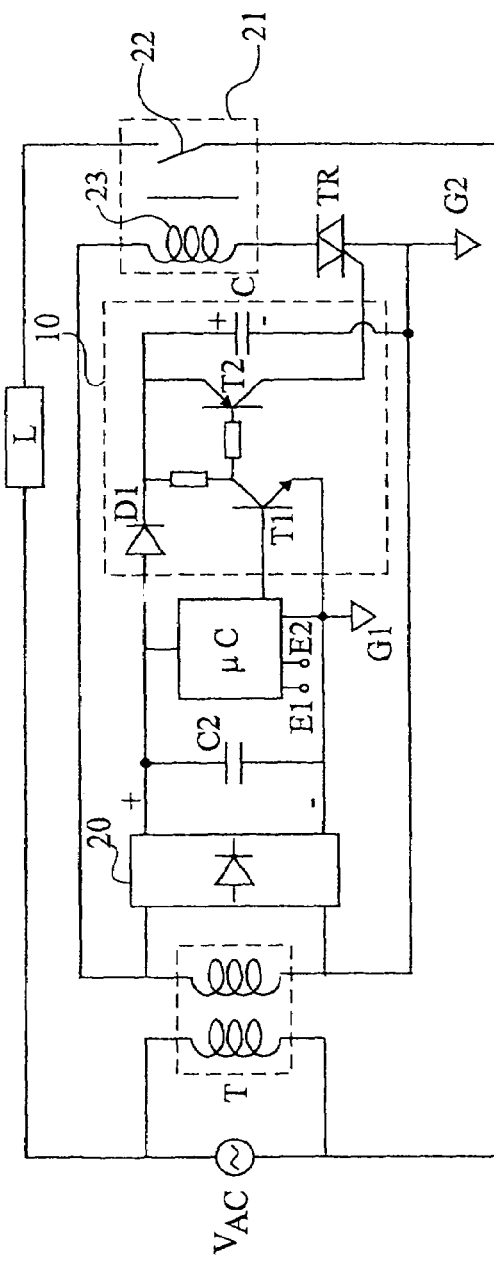
FIG. 6 shows an electromagnetic relay control circuit according to the present invention.

Thus, the present invention provides, as shown in FIG. 6, connecting the terminals of the relay coil, not to the output of rectifier 20, but directly to the secondary of transformer T, in series with a triac TR. Coupling circuit 10 according to the present invention enables solving galvanic isolation problems posed by the control of triac TR connected to a reference voltage G2 different from reference voltage G1 of control circuit μC.

Thus, the disadvantages of the state of the art are solved by means of a simple circuit. Indeed, coil 23 being supplied by an A.C. current, its impedance is higher than in the case where it is supplied by a D.C. current. To obtain the electromagnetic power required for a relay activation, the current in the coil may be lower. In practice, this current is reduced by a factor from 3 to 5. This enables reducing the dimension of transformer T and the capacitance of capacitor C2. The necessity of providing an additional device enabling blocking of the relay switch is thus eliminated.

The present invention has been generally discussed in relation with FIG. 2, in more detail in relation with FIG. 4, and in the context of a specific application with FIG. 6. It should be noted that it generally applies in all the cases where a current-controlled bidirectional switch is desired to be controlled by means of a control circuit having a voltage reference different from the A.C. supply circuit voltage reference.

The present invention also applies to the control of a voltage-controlled bidirectional switch.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for controlling a bidirectional switch referenced to a first ground connection by a control circuit supplied by a first voltage and referenced to a second ground connection, wherein the supply voltage of the control circuit is connected by a diode to a coupling circuit comprising a node, this node being connected:
   via a first impedance, to the collector of an NPN transistor having its emitter connected to the second ground connection and having its base receiving the output of the control circuit,
   to a first terminal of a capacitor having its second terminal connected to the first ground connection, and
   to the emitter of a PNP transistor having its base connected to the collector of the NPN transistor via a second impedance, and having its collector connected to the control terminal of the bidirectional switch,
   wherein the first ground connection is independent from the second ground connection.

2. The circuit of claim 1, wherein the collector of the PNP transistor is connected to the control terminal of the bidirectional switch via a control current limiting resistor.

3. A circuit for controlling an electromagnetic relay of control of a load with an A.C. voltage, comprising a transformer which supplies, on the one hand, a control coil in series with a current-controlled bidirectional switch and, on the other hand, via a rectifier, a circuit for controlling said switch, using a control circuit according to claim 1.

* * * * *

UNITED STATES PATENT AND TRADEMARK OFFICE
CERTIFICATE OF CORRECTION

| | | |
|---|---|---|
| PATENT NO. | : 7,224,087 B2 | Page 1 of 1 |
| APPLICATION NO. | : 10/744333 | |
| DATED | : May 29, 2007 | |
| INVENTOR(S) | : Laurent Gonthier et al. | |

It is certified that error appears in the above-identified patent and that said Letters Patent is hereby corrected as shown below:

On the title page, Item (75) should read:
(75) Inventors: Laurent Gonthier, Tours (FR); Benoît Peron, Tours (FR)

Claim 3, col. 4, lines 61-63 should read:
former which supplies a control coil in series with a current-controlled bidirectional switch and via a rectifier, a circuit for controlling said Signed and Sealed this Tenth Day of July, 2007

JON W. DUDAS
*Director of the United States Patent and Trademark Office*